(12) United States Patent
Dakeya et al.

(10) Patent No.: US 6,873,299 B2
(45) Date of Patent: Mar. 29, 2005

(54) DUAL RESONANCE ANTENNA APPARATUS

(75) Inventors: Yujiro Dakeya, Omihachiman (JP); Shinji Matsutaka, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/468,298

(22) PCT Filed: Dec. 19, 2002

(86) PCT No.: PCT/JP02/13260
§ 371 (c)(1),
(2), (4) Date: Aug. 20, 2003

(87) PCT Pub. No.: WO03/055087
PCT Pub. Date: Jul. 3, 2003

(65) Prior Publication Data
US 2004/0075614 A1 Apr. 22, 2004

(30) Foreign Application Priority Data

Dec. 20, 2001 (JP) ......................................... 2001-387543
Nov. 18, 2002 (JP) ......................................... 2002-333136

(51) Int. Cl.$^7$ ................................................. H01Q 9/00
(52) U.S. Cl. ........................................ 343/745; 343/749
(58) Field of Search ............................... 343/725, 745, 343/749

(56) References Cited

U.S. PATENT DOCUMENTS 4,225,822 A * 9/1980 Kariatsumari ............... 455/108
5,701,107 A * 12/1997 Kasahara et al. ............ 333/164
5,963,113 A * 10/1999 Ou et al. ..................... 333/193
2002/0025785 A1 * 2/2002 Satoh et al. .................. 455/78

FOREIGN PATENT DOCUMENTS

| JP | 01-151829 | 6/1989 |
| JP | 2001-36328 | 2/2001 |
| JP | 2001-185936 | 7/2001 |
| JP | 2001-185937 | 7/2001 |
| JP | 2001-185949 | 7/2001 |

OTHER PUBLICATIONS

Antenna Engineering Handbook; ISBN 4-274-02677-9; 1980; pp. 44-45.

* cited by examiner

Primary Examiner—Tho Phan
(74) Attorney, Agent, or Firm—Keating & Bennett LLP

(57) ABSTRACT

A multi-resonant antenna device includes an antenna element and an LC parallel resonance circuit making the antenna element resonate in a plurality of frequency bands, and the LC parallel resonance circuit includes a T-type circuit or PI-type circuit including an inductance element, acting as a shunt element, and capacitance elements, which prevent the impedance from becoming infinite in a certain frequency band. In this way, a drop, that is, a notch portion, in the frequency characteristic causing deterioration of the gain can be eliminated.

18 Claims, 12 Drawing Sheets

DUAL RESONANCE ANTENNA APPARATUS

BACKGROUND OF THE INVENTION

1. Field of the Invention

The present invention relates to a multi-resonant antenna device which resonates in a plurality of frequency bands and more particularly, the present invention relates to an improvement in the gain of a multi-resonant antenna device.

2. Description of the Related Art

The circuit construction shown in FIG. 10 or FIG. 11 is adopted in order to realize a multi-resonant antenna device resonating in two frequency bands, for example (see "Antenna Engineering Handbook", pp. 44–45, compiled by The Institute of Electronics, Information and Communication Engineers and published by Ohmsha on Oct. 30, 1981).

In a multi-resonant antenna device 1 shown in FIG. 10, one antenna element 2 is used and power is supplied to the antenna element 2 from a power supply circuit 3 through one feeding point 4.

Between the antenna element 2 and the power supply circuit 3, an inductance element 5 and capacitance elements 7 and 8 are connected to constitute an LC parallel resonance circuit 9. More specifically, the inductance element 5 and the capacitance element 7 are connected in series between the antenna element 2 and the power supply circuit 3. The capacitance element 8 is connected in parallel with the series circuit of the inductance element and the capacitance element 7.

Furthermore, an inductance element 6 is connected between the feeding point 4 and ground. This inductance element 6 is to match the input impedance of the antenna element 2 with the impedance of the power supply circuit 3.

In a multi-resonant antenna device 11 shown in FIG. 11, two antenna elements 12 and 13 are used. Power is supplied to the antenna elements 12 and 13 from a power supply circuit 14 through a feeding point 15.

An inductance element 16 is connected between the antenna element 12 and the power supply circuit 14, and a capacitance element 18 is connected between the antenna element 13 and the power supply circuit 14. Furthermore, an inductance element 17 is connected between the feeding point 15 and ground. The inductance element 17 is to match the input impedance of the antenna elements 12 and 13 with the impedance of the power supply circuit 14.

The multi-resonant antenna device 11 is made to resonate in two frequency bands such that the resonance frequency of each of the antenna elements 12 and 13 is matched to a desired frequency band.

However, the multi-resonant antenna devices 1 and 11 shown in FIGS. 10 and 11 have the following problem.

FIG. 12 shows the reflection frequency characteristic $S_{11}$ and transmission frequency characteristic $S_{21}$ of the multi-resonant antenna device 1 and 11. In FIG. 12, two resonance frequencies $f_1$ and $f_2$ are shown.

In the multi-resonant antenna device 1 shown in FIG. 10, the LC parallel resonance circuit 9 has an antiresonant frequency which is determined by the inductance component and capacitance components contained therein and the impedance becomes infinite at that frequency. As a result, a drop in the gain, that is, a notch portion 20 appears between the two resonance frequencies $f_1$ and $f_2$ in the transmission characteristic $S_{21}$.

The above problems will be described with reference to FIG. 13. FIG. 13 is a Smith chart showing the impedance frequency characteristic ($S_{11}$) of the LC parallel resonance circuit 9 shown in FIG. 10.

The impedance frequency characteristic ($S_{11}$) of the LC parallel resonance circuit 9 is shown by a circular locus extending from an inductive point to a capacitive point on the Smith chart, as shown in FIG. 13. That is, the frequency characteristic is inductive in the 800 MHz band, that is, the locus is on the upper side of the Smith chart, and the frequency characteristic is capacitive in the 1.5 GHz band, that is, the locus is on the lower side of the Smith chart.

In the LC parallel resonance circuit 9 shown in FIG. 10, since the locus showing the impedance frequency characteristic passes through the rightmost point representing infinity on the Smith chart at the frequency of 1.2 GHz, the notch portion 20 showing the drop in gain appears between the two resonance frequencies $f_1$ and $f_2$, as described above.

On the other hand, also in the multi-resonant antenna device 11 shown in FIG. 11, since the two antenna elements 12 and 13 are located close to each other, those antenna elements 12 and 13 are capacitively coupled and a parallel resonance circuit is formed due to the capacitance and inductance components contained in the antenna elements 12 and 13. This parallel resonance circuit has the same construction as in the LC parallel resonance circuit 9 shown in FIG. 10, and accordingly, also in the case of the multi-resonant antenna device 11 shown in FIG. 11, the notch portion 20, indicating the drop in gain, appears between the two resonance frequencies $f_1$ and $f_2$ in the transmission characteristics $S_{21}$, as shown in FIG. 12, which is the same as in the multi-resonant antenna device 1 shown in FIG. 10.

Such a notch portion 20 becomes the cause of deterioration of the gain and accordingly it must be eliminated.

SUMMARY OF THE INVENTION

In order to overcome the problems described above, preferred embodiments of the present invention provide a multi-resonant antenna device that eliminates a drop, that is, a notch portion, in the frequency characteristic causing deterioration of the gain.

A multi-resonant antenna device according to a first preferred embodiment includes an antenna element and an LC resonance circuit arranged to cause the antenna element to resonate in a plurality of frequency bands. In the multi-resonant antenna device, the LC resonant circuit includes a T-type circuit or PI-type circuit, including an inductance element and a capacitance element, for preventing the impedance from becoming infinite in a certain frequency band.

In the LC resonance circuit of the first preferred embodiment, the LC resonance circuit also includes a diode switching circuit connected in parallel with the T-type circuit or PI-type circuit and the antenna element may be made to resonate in three or more frequency bands by turning on and off the diode switching circuit.

A multi-resonant antenna device according to a second preferred embodiment includes two antenna elements resonating in a plurality of frequency bands. In the multi-resonant antenna device, a T-type circuit or PI-type circuit, including an inductance element and a capacitance element, for preventing the impedance from becoming infinite in a certain frequency band, is included between at least one of the antenna elements and a feeding point.

Other features, elements, characteristics and advantages of the present invention will become more apparent from the following detailed description of preferred embodiments thereof with reference to the attached drawings.

DETAILED DESCRIPTION OF PREFERRED EMBODIMENTS

First Preferred Embodiment

Figure 1:
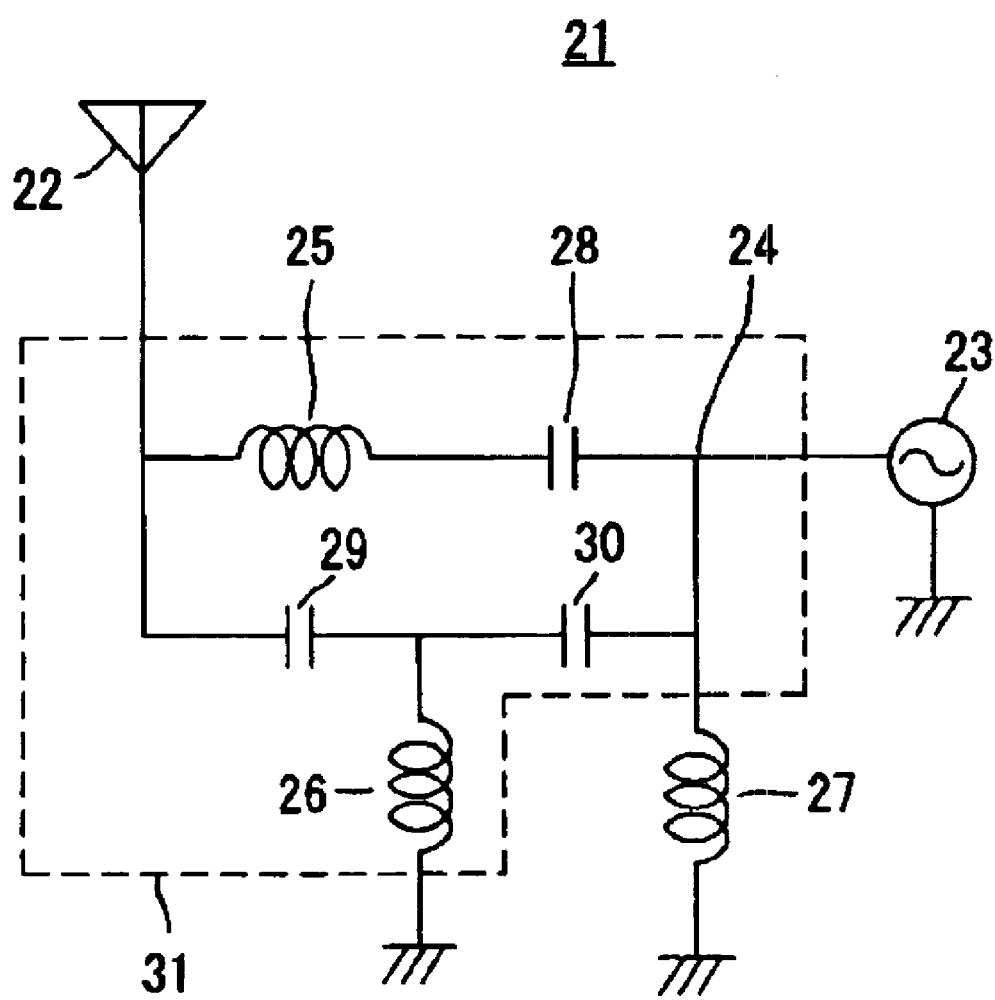
FIG. 1 is a circuit diagram of a multi-resonant antenna device according to a first preferred embodiment of the present invention.

FIG. 1 is a circuit diagram of a multi-resonant antenna device 21 according to a first preferred embodiment of the present invention.

The multi-resonant antenna device 21 includes one antenna element 22 and power is supplied to the antenna element 22 from a power supply circuit 23 through one feeding point 24.

Between the antenna element 22 and the power supply circuit 23, inductance elements 25 and 26 and capacitance elements 28, 29, and 30 are connected to constitute an LC parallel resonance circuit 31. More specifically, between the antenna element 22 and the power supply circuit 23, the inductance element 25 and the capacitance element 28 are connected in series to constitute an LC series circuit. Then, a T-type circuit including the capacitance elements 29 and 30 and the inductance element (inductor) 26 as a shunt element is connected in parallel with the series circuit including the inductance element 25 and the capacitance element 28.

Furthermore, an inductance element 27 is connected between the feeding point 24 and ground. The inductance element 27 functions as a matching element for matching the input impedance of the antenna element 22 to the impedance of the power supply circuit 23.

That is, this LC resonance circuit 31 includes an LC series circuit including the inductance element 25 and the capacitance element 28 and a parallel resonance circuit including the capacitance elements 29 and 30 connected in parallel to the LC series circuit, and also includes a T-type circuit including the capacitance elements 29 and 30 and the inductance element 26 (hereinafter, the LC parallel circuit may be called an LC parallel resonance circuit).

Figure 2:
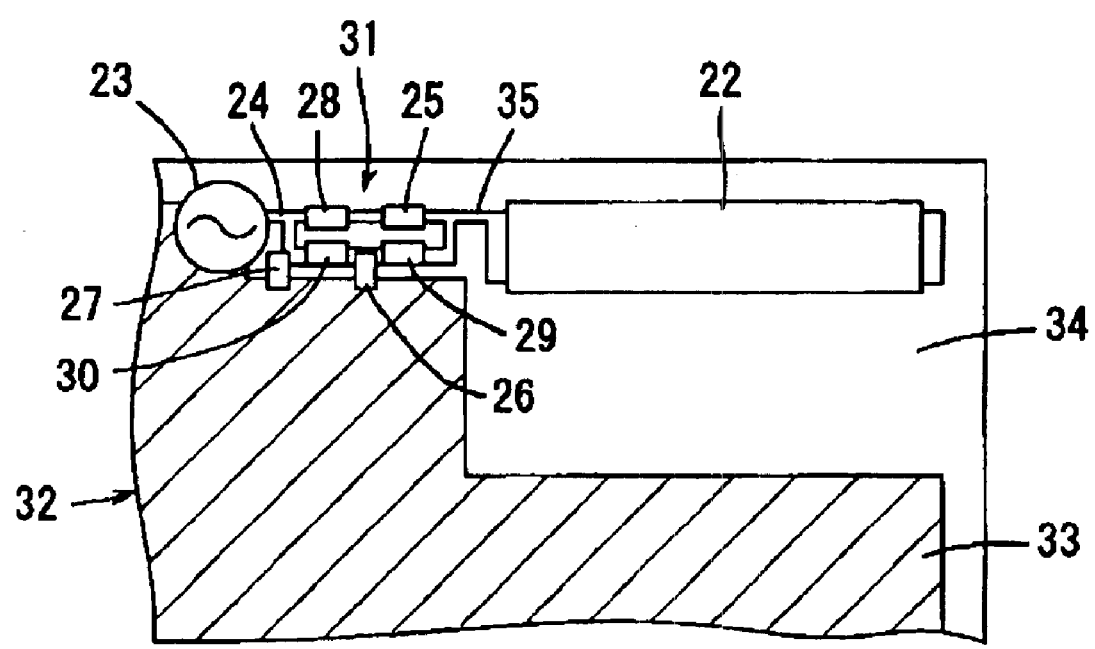
FIG. 2 is a top view showing how the antenna element shown in FIG. 1 is mounted on a mounting board.

FIG. 2 shows how the antenna element 22, which is preferably a chip antenna, is mounted.

With reference to FIG. 2, a grounding conductive film 33 shown by hatching is provided on a mounting board (mother board) 32 for mounting the antenna element 22. A portion of the outer area of the grounding conductive film 33 is cut away and a substantially rectangular conductive-film cut-away area 34 is provided in a corner portion of the mounting board 32. The antenna element 22 is mounted in the conductive-film cutaway area 34 on the mounting board 32.

Furthermore, FIG. 2 also shows how the gain-deterioration-prevention LC circuit 31, to be connected to the above antenna element 22, is mounted.

A wiring conductive film 35 is provided in the conductive-film cutaway area 34 on the mounting board 32, and chip elements such as chip inductors, chip capacitors, and other elements, constituting the above-mentioned inductance elements 25, 26, and 27 and capacitance elements 28, 29, and 30 are mounted so as to be electrically connected to the wiring conductive film 35 and, when required, to be electrically connected to the grounding conductive film 33.

In FIG. 2, the same reference numerals are used for elements corresponding to the elements shown in FIG. 1, and therefore, it should be understood how each part is mounted on the mounting board 32 with reference to FIGS. 1 and 2.

Figure 3:
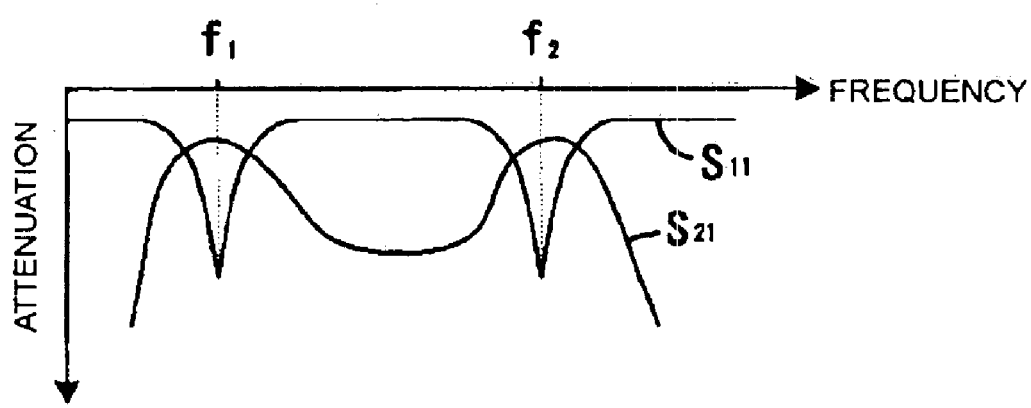
FIG. 3 shows the frequency characteristics obtained by the multi-resonant antenna device shown in FIG. 1.
Figure 12:
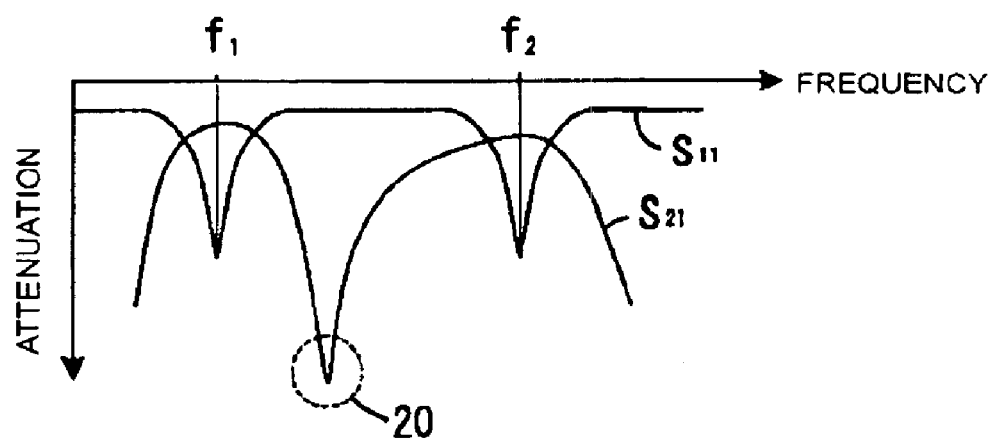
FIG. 12 shows the frequency characteristics of the multi-resonant antenna device shown in FIG. 10 and the multi-resonant antenna device shown in FIG. 11.
Figure 13:
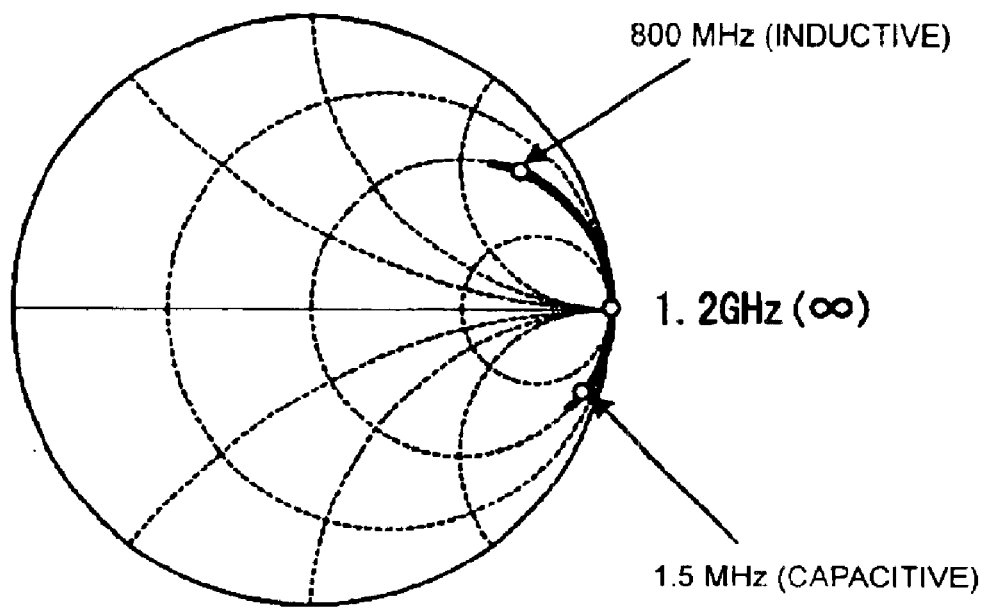
FIG. 13 is a Smith chart showing the impedance frequency characteristic ($S_{11}$) of the LC parallel resonance circuit shown in FIG. 10.

FIG. 3, which corresponds to FIG. 12, shows the reflection frequency characteristic $S_{11}$ and transmission frequency characteristic $S_{21}$ of the multi-resonant antenna device 21.

As shown in FIG. 3, although the multi-resonant antenna device 21 has two resonance frequencies $f_1$ and $f_2$, no drop in gain, that is, no notch portion, is caused between the two resonance frequencies $f_1$ and $f_2$ in the frequency characteristic $S_{21}$.

Figure 4:
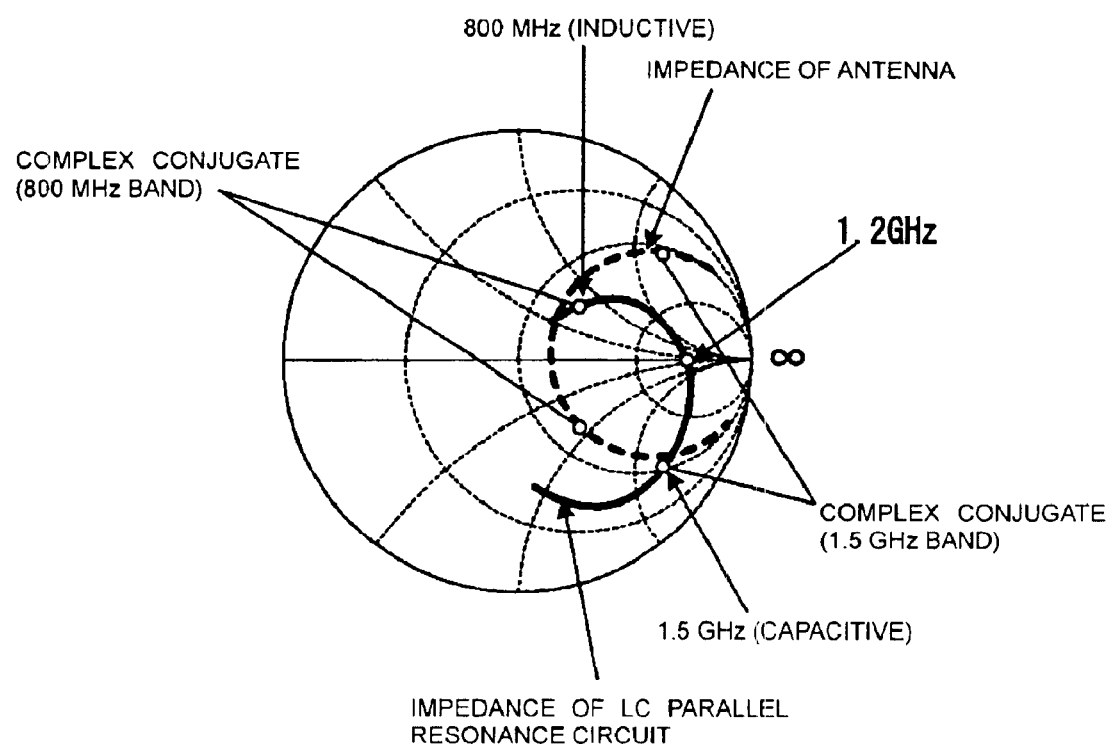
FIG. 4 is a Smith chart showing the impedance frequency characteristic ($S_{11}$) of the LC parallel resonance circuit and the frequency characteristics of the impedance ($S_{11}$) of the antenna element shown in FIG. 1.

This will be further described with reference to FIG. 4. FIG. 4 is a Smith chart showing the impedance frequency characteristic ($S_{11}$) of the LC resonance circuit 31 shown in FIG. 1.

The impedance frequency characteristic ($S_{11}$) of the LC parallel resonance circuit 31 is shown as a circular locus extending from an inductive point to a capacitive point on the Smith chart, as shown by a thick solid line in FIG. 4. That is, the impedance is inductive in the 800 MHz band on the upper side of the Smith chart and the impedance is capacitive in the 1.5 GHz band on the lower side of the Smith chart. This fact is the same as in the case of the LC resonance circuit 9 shown as related art in FIG. 10.

However, in the case of the LC resonance circuit 31 shown in FIG. 1, the locus showing the impedance frequency characteristic ($S_{11}$) moves to the left side on the Smith chart and accordingly the locus does not pass through the rightmost point representing infinity. Therefore, as shown in FIG. 3, the multi-resonant antenna device 21 shown in FIG. 1 does not have any notch portion 20, showing the drop in gain, between the two frequencies $f_1$ and $f_2$ in the transmission characteristic $S_{21}$.

Furthermore, the impedance frequency characteristics ($S_{11}$) of the antenna element 22 is shown by a thick broken line in FIG. 4. The impedance frequency characteristic ($S_{11}$) of the open-ended antenna element 22 is shown by a circular locus extending from a capacitive point to an inductive point. In this case, when the resonance frequency of the antenna element 22 and the characteristic value of each of the elements 25, 26, and 28 to 30 provided in the LC parallel resonance circuit 31 are properly determined, the frequency characteristics can be made complex conjugates, that is, the circular locus can be positioned so as to be symmetrical about the horizontal line in the 800 MHz band and the 1.5 GHz band, and thus matching, that is, resonance, can be achieved at each frequency.

Hereinafter, a more specific preferred embodiment will be described. Moreover, in this preferred embodiment, a multi-resonant antenna device which resonates in the two frequency bands for EPDC800 (800 MHz band) and PDC1500 (1.5 GHz band) is taken as an example and described.

In the multi-resonant antenna device 21 shown in FIG. 1, if no gain-deterioration-prevention LC circuit 31 is provided, one resonance will appear in the vicinity of 1.2 GHz, for example. On the other hand, as shown in FIG. 1, when the gain-deterioration-prevention LC circuit 31 is used, two resonances will appear around $f_1$=850 MHz and $f_2$=1.5 GHz, respectively.

In this case, the LC resonance circuit 31 is constructed so as to be inductive in the 850 MHz band and capacitive in the 1.5 GHz band.

Therefore, according to the multi-resonant antenna device 21, since the LC parallel resonance circuit 31 is constructed so that there is no antiresonant frequency where the impedance becomes infinite, the LC circuit 31 is inductive and capacitive in the two frequency bands respectively, and the LC circuit 31 resonates in these two frequency bands, the notch portion can be prevented, as described above.

Figure 10:
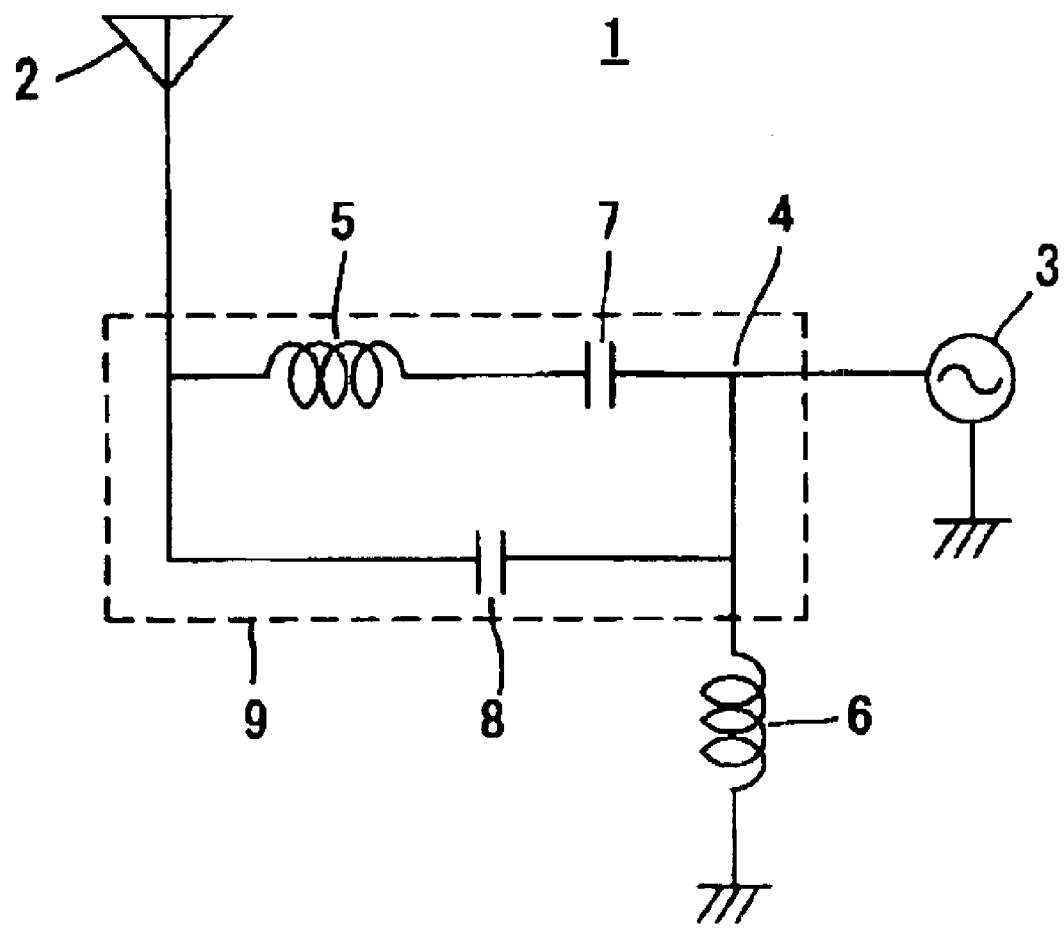
FIG. 10 is a circuit diagram of a related multi-resonant antenna device with regard to the present invention.

Based on a certain specific example where a chip element is mounted in the same way as in FIG. 2, when the frequency characteristics of each of the multi-resonant antenna device 21 shown in FIG. 1 and the related multi-resonant antenna device 1 shown in FIG. 10 were considered, the typical characteristics as shown in Table 1 and Table 2 were obtained. Table 1 shows the typical frequency characteristics of the multi-resonant antenna device 21 shown in FIG. 1 and Table 2 shows the typical frequency characteristics of the multi-resonant antenna device 1 shown in FIG. 10.

TABLE 1

| Band | Resonance frequency [MHz] | Bandwidth [MHz] | Maximum gain [dBd] | Efficiency [dB] |
|---|---|---|---|---|
| 800 MHz | 855 | 54.6 | −2.3 | −3.0 |
| 1.5 GHz | 1486 | 49.4 | −3.0 | −4.8 |

TABLE 2

| Band | Resonance frequency [MHz] | Bandwidth [MHz] | Maximum gain [dBd] | Efficiency [dB] |
|---|---|---|---|---|
| 800 MHz | 845 | 53.8 | −2.6 | −3.3 |
| 1.5 GHz | 1487 | 36.5 | −3.1 | −4.8 |

When Table 1 and Table 2 are compared, it is understood that the gain of the multi-resonant antenna device 21 of FIG. 1, which is shown in Table 1, is improved.

Second Preferred Embodiment

Figure 5:
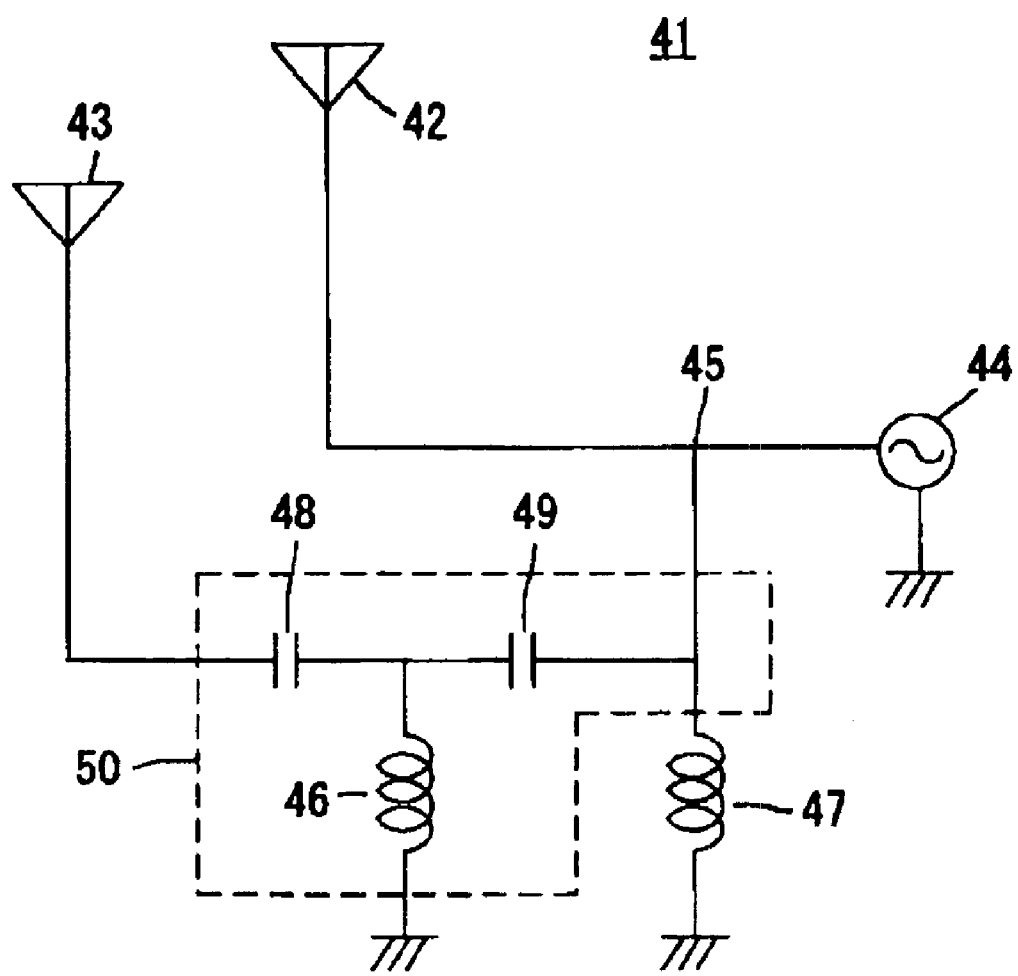
FIG. 5 is a circuit diagram of a multi-resonant antenna device according to a second preferred embodiment of the present invention.

FIG. 5 shows the circuit diagram of a multi-resonant antenna device 41 according to a second preferred embodiment of the present invention.

With reference to FIG. 5, the multi-resonant antenna device 41 includes two antenna elements 42 and 43. These multi-resonant antenna devices 42 and 43 used have different resonant frequencies from each other, 800 MHz and 1.5 GHz, for example. Power is supplied to the antenna elements 42 and 43 from a power supply circuit 44 through one feeding point 45.

Between at least one of the antenna elements 42 and 43 and the power supply circuit 44, that is, between the antenna element 43 and the power supply circuit 44 in the present preferred embodiment, two capacitance elements 48 and 49 are connected in series and an inductor 46 as a shunt element is connected between the middle point of the capacitance elements 48 and 49 and ground, and thus a T-type LC circuit 50 including the capacitance elements 48 and 49 and the inductance element 46 is constructed.

Furthermore, an inductance element 47 is connected between the feeding point 45 and ground. This inductance element 47 is to match the input impedance of the antenna elements 42 and 43 to the impedance of the power supply circuit 44.

Figure 6:
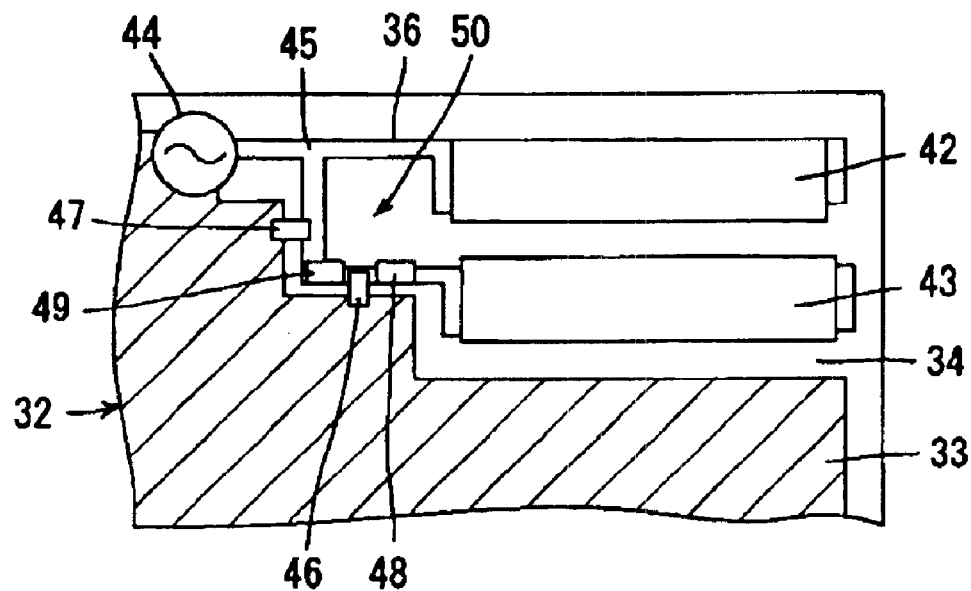
FIG. 6 shows how the two antenna elements shown in FIG. 5 are mounted on the mounting board.

Regarding each of the above-described antenna elements 42 and 43, a chip antenna can be used and, when such a chip antenna is used, the antenna elements 42 and 43 can be mounted as shown in FIG. 6. That is, the antenna elements 42 and 43 can be mounted in the conductive-film cutaway area 34 on the mounting board 32 so as to be parallel.

Furthermore, FIG. 6 shows how the T-type LC circuit 50, to be connected to the above antenna elements 42 and 43, and the inductance element 47 are mounted.

In the conductive-film cutaway area 34 on the mounting board 32, a wiring conductive film 36 is provided and chip elements defining each of the inductance elements 46 and 47 and the capacitance elements 48 and 49 are mounted so as to be electrically connected to the wiring conductive film 36 and, when required, so as to be electrically connected to the grounding conductive film 33.

In FIG. 6, the same reference numerals are given to elements corresponding to the elements shown in FIG. 5, and therefore, it should be understood how each part is mounted on the mounting board 32 with reference to FIGS. 5 and 6.

Also in this preferred embodiment, since the T-type LC circuit 50 constructed as described above is provided, it is possible to prevent the occurrence of a notch portion between the resonance frequency $f_1$ of the antenna element 42 and the resonance frequency $f_2$ of the antenna element 43 in the same way as in the case of the characteristics shown in FIG. 3. This will be described in detail below.

Figure 7:
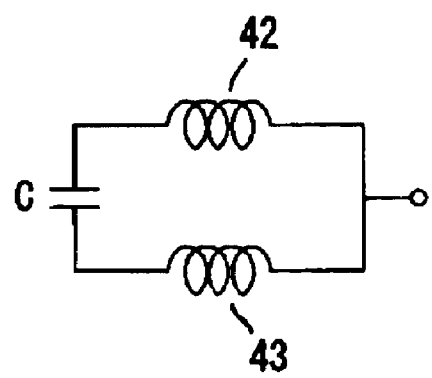
FIG. 7 is an equivalent circuit diagram of the two antenna elements which are located close to each other, as shown in FIGS. 5 and 6, and are capacitively coupled.

As shown in FIG. 6, when the antenna elements 42 and 43 are disposed close to each other, the two antenna elements 42 and 43 are capacitively coupled. Furthermore, each of the antenna elements 42 and 43 has an inductance component. Therefore, as shown in FIG. 7, a parallel resonance circuit is defined by the inductance component of the antenna 42, the inductance component of the antenna 43, and a capacitance due to the capacitance coupling between them. In such a parallel resonance circuit, a frequency where the impedance becomes infinite exists in the same way as in the case of the LC parallel resonance circuit 9 shown as a related art in FIG. 10, which causes a notch portion.

In contrast with this, according to the present preferred embodiment, since the T-type LC circuit 50 shown in FIG. 5 is inserted between at least one of the antenna elements 42 and 43 and the power supply circuit 44, there will be no frequency at which the impedance becomes infinite in the same way as described with reference to FIG. 4 in the first preferred embodiment, and accordingly it is possible to eliminate a notch portion between the resonance frequency $f_1$ of the antenna element 41 and the resonance frequency $f_2$ of the antenna element 42.

Figure 11:
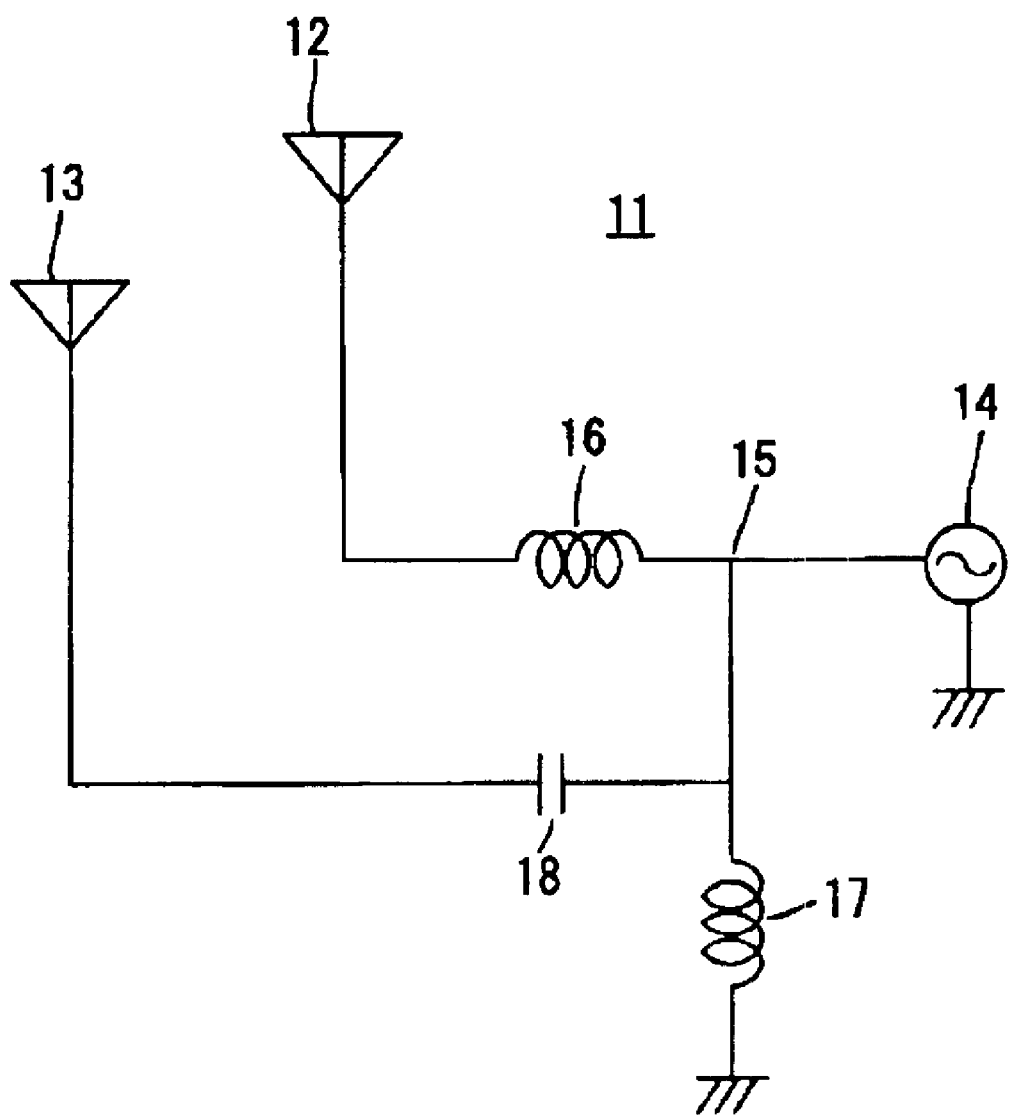
FIG. 11 is a circuit diagram of another related multi-resonant antenna device with regard to the present invention.

Based on a certain specific example where a chip element is mounted in the same way as in FIG. 6, when the frequency characteristics of each of the multi-resonant antenna device 41 shown in FIG. 5 and the related multi-resonant antenna device 11 shown in FIG. 11 are considered, the typical characteristics shown in Table 3 and Table 4 were obtained. Table 3 shows the typical frequency characteristics of the multi-resonant antenna device 41 shown in FIG. 5 and Table 4 shows the typical frequency characteristics of the multi-resonant antenna device 11 shown in FIG. 11.

TABLE 3

| Band | Resonance frequency [MHz] | Bandwidth [MHz] | Maximum gain [dBd] | Efficiency [dB] |
| --- | --- | --- | --- | --- |
| 800 MHz | 841 | 37.4 | −2.3 | −2.6 |
| 1.5 GHz | 1490 | 61.7 | −2.6 | −4.2 |

TABLE 4

| Band | Resonance frequency [MHz] | Bandwidth [MHz] | Maximum gain [dBd] | Efficiency [dB] |
| --- | --- | --- | --- | --- |
| 800 MHz | 855 | 45.3 | −2.7 | −2.9 |
| 1.5 GHz | 1496 | 46.2 | −2.7 | −4.3 |

When Table 3 and Table 4 are compared, it is understood that the gain of the multi-resonant antenna device 41 of FIG. 5, which is shown in Table 3, is improved.

In the first and second preferred embodiments described above, the following modification can also be made regarding the LC parallel resonance circuit 31 and T-type LC circuit 50.

For example, regarding the multi-resonant antenna device 21 shown in FIG. 1, either of the capacitance elements 29 and 30 may be replaced with an inductance element and the inductance element 25 may be replaced with a capacitance element.

Furthermore, at least in a portion of the LC resonance circuit 31, a PI-type circuit may be constructed such that another inductance element is provided as a shunt element between the inductance element 25 and the inductance element 26 so as to sandwich the capacitance element 29. The same can also applies to the multi-resonant antenna device 41 shown in FIG. 5.

Third Preferred Embodiment

Figure 8:
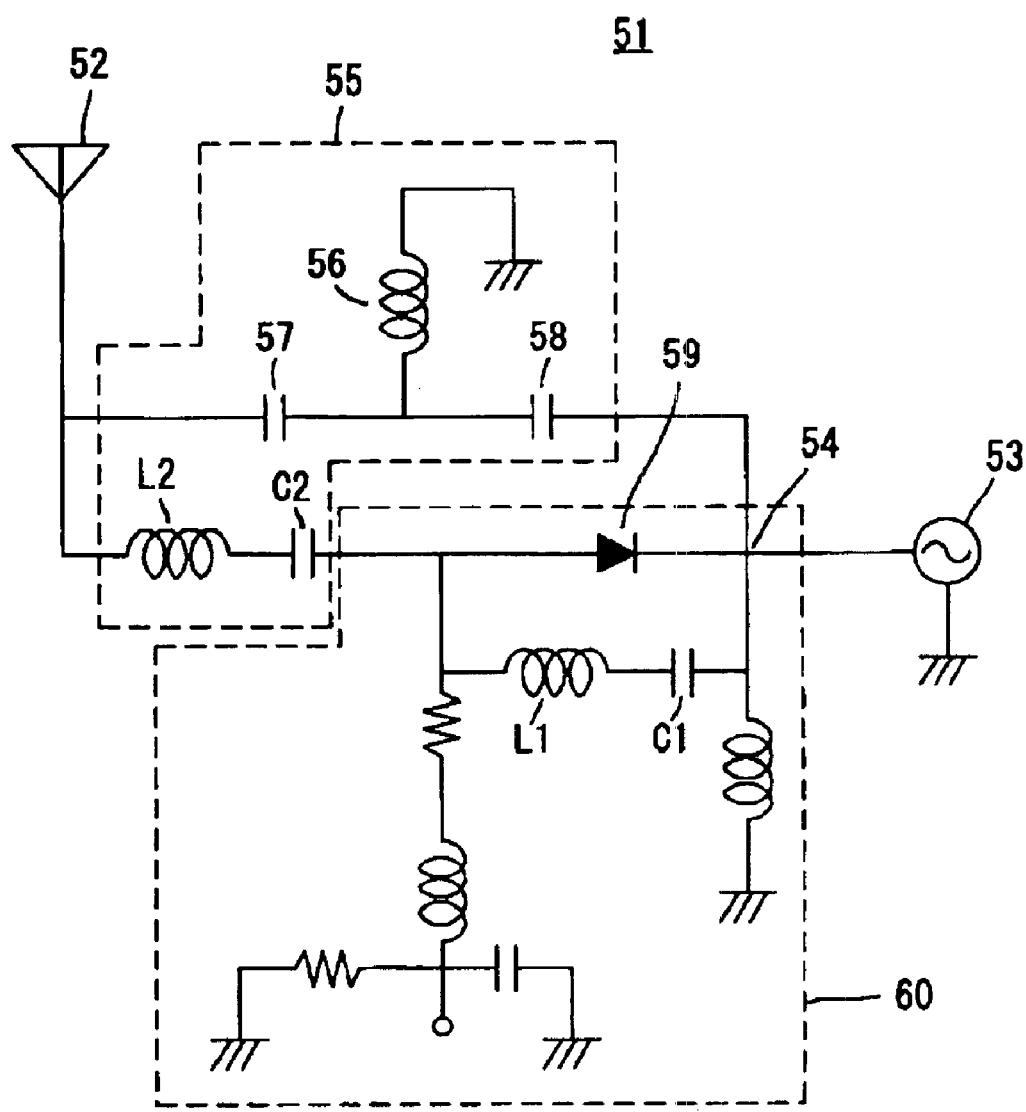
FIG. 8 is a circuit diagram of a multi-resonant antenna device according to a third preferred embodiment of the present invention.

FIG. 8 is a circuit diagram of a multi-resonant antenna device 51 according to a third preferred embodiment of the present invention.

As shown in FIG. 8, the multi-resonant antenna device 51 includes one antenna element 52 and power is supplied to the antenna element 52 from a power supply circuit 53 through one feeding point 54.

Furthermore, the multi-resonant antenna device 51 is provided with an LC parallel resonance circuit 55 for preventing deterioration of the gain of the antenna element 52. In the same way as in the case of the above LC parallel resonance circuit 31, the LC parallel resonance circuit 55 includes an inductance element 56 and capacitance elements 57 and 58, and a T-type circuit includes the inductance element 56, acting as a shunt element, and the capacitance elements 57 and 58 connected in series to the antenna element 52.

This preferred embodiment is characterized in that a diode switching circuit 60 including a diode 59 is also included in the multi-resonant antenna device 51. The diode switching circuit 60 is inserted between a series circuit of the inductance element L2 and the capacitance element C2, which are included in the LC parallel resonance circuit 55, and the power supply circuit 53 and is connected in parallel with the T-type circuit of the inductance element 56 and the capacitance elements 57 and 58, which are included in the LC parallel resonance circuit 55.

The diode switching circuit 60 is for increasing the number of resonant frequency bands. For example, the switching between the 800 MHz-digital band (810 MHz to 843 MHz) and the 800 MHz-analog band (870 MHz to 885 MHz) of EPDC800 can be achieved by turning on and off the diode switching circuit 60 and, as a result, the multi-resonant antenna device 51 can cope with three different frequency bands, for example, the 800 MHz-digital band, the 800 MHz-analog band, and the 1.5 GHz band.

The operation of the diode switching circuit 60 will now be described more specifically.

While the diode switching circuit 60 is turned on, the diode is short-circuited to reduce the impedance. At this time, practically no current flows in the inductance element $L_1$ and the capacitance element $C_1$ provided in the diode switching circuit 60. Therefore, it is practically the same as the condition in which there is no diode switching circuit 60, and accordingly, resonance can be achieved in both the 800 MHz-analog band and the 1.5 GHz band.

On the other hand, while the diode switching circuit 60 is turned off, the diode 59 is open-circuited to increase the impedance. At this time, current flows to the side with the inductance element $L_1$ and the capacitance element $C_1$ provided in the diode switching circuit 60. Therefore, the inductance component of the inductance element $L_1$ and the capacitance component of the capacitance element $C_1$ are added to the inductance component of the inductance element $L_2$ and the capacitance component of the capacitance element $C_2$ in the LC parallel resonance circuit 55, respectively, and, as a result, the characteristic value of each element in the LC parallel resonance circuit 55 changes and thus resonance is achieved in the 800 MHz-digital band.

Furthermore, also in the present preferred embodiment, since the LC parallel resonance circuit 55 including a T-type circuit including the inductance element 56 and the capacitance elements 57 and 58 is provided, the drop in gain, that is, the notch portion, is effectively eliminated.

Figure 9:
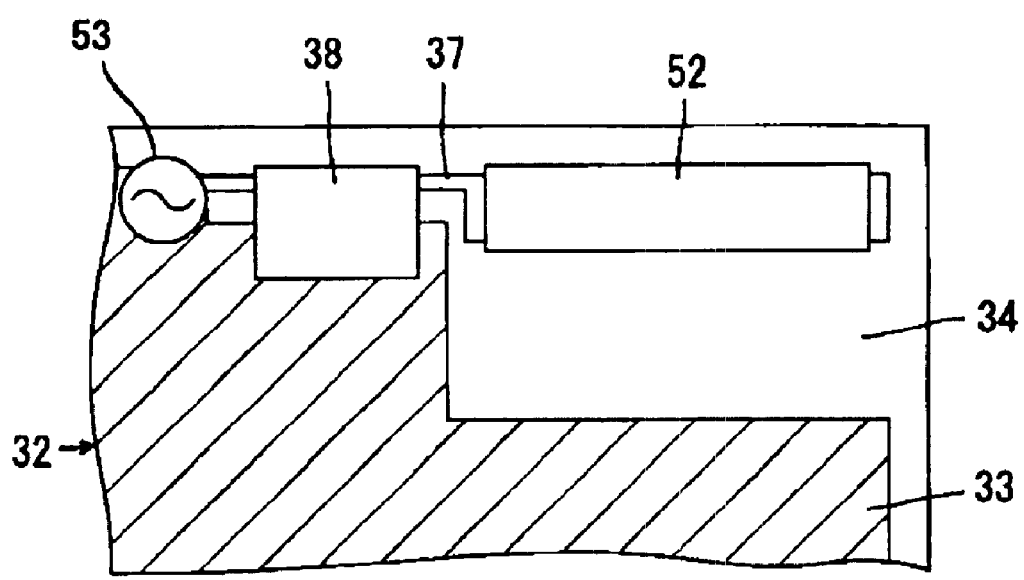
FIG. 9 is a top view showing how the antenna element shown in FIG. 8 is mounted on the mounting board.

Also, in the above-described antenna element 52, a chip antenna can be used. When such a chip antenna is used, the antenna element 52 can be mounted as shown in FIG. 9. That is, the antenna element 52 can be mounted in the conductive-film cutaway area 34 on the mounting board 32.

In the conductive-film cutaway area 34 on the mounting board 32, a wiring conductive film 37 is provided and a module chip 38, in which the above-described LC parallel resonance circuit 55, the diode switching circuit 60, etc., are integrated, is mounted so as to be electrically connected to the wiring conductive film 37 and the grounding conductive film 33. Moreover, the module chip 38 may be replaced with the plurality of chip elements shown in FIGS. 2 and 6.

Based on a certain specific example, when the frequency characteristics of the multi-resonant antenna device 51 shown in FIG. 8 is considered, the typical characteristics as shown in Table 5 were obtained. In Table 5, "800 MHz-D" and "800 MHz-A" represent the "800 MHz-digital band" and the "800 MHz-analog band", respectively.

TABLE 5

| Band | Diode On/Off | Resonance frequency [MHz] | Bandwidth [MHz] | Maximum gain [dBd] | Efficiency [dB] |
|---|---|---|---|---|---|
| 800 MHz-D | Off | 827 | 47.1 | −3.6 | −4.3 |
| 1.5 GHz-A | On | 878 | 55.0 | −2.4 | −3.1 |
| 1.5 GHz | Off | 1488 | 49.3 | −2.9 | −4.6 |

Furthermore, in the above-described specific preferred embodiment, the multi-resonant antenna device for EPDC800 and PDC1500 is described, but the antenna device is not limited to that and, for example, other combinations such as EPDC800 and GPS, EPDC800 and PHS, etc., can be utilized.

As described above, according to each of the preferred embodiments of the present invention, when a multi-resonant antenna device is realized using one antenna element, since an LC resonance circuit, which makes the antenna element resonate in a plurality of frequency bands, is provided with a T-type circuit or PI-type circuit including an inductance element and a capacitance element, which prevents the inductance from becoming infinite in a certain frequency band, the drop in gain, that is, the notch potion, can be eliminated and thus deterioration of the gain can be prevented.

In the above-described case, when a diode switching circuit to be connected in parallel with the T-type circuit or PI-type circuit is further included, the antenna element can be made to resonate in three or more frequency bands by turning on and off the diode switching circuit.

Furthermore, when a multi-resonant antenna device is realized by using two antenna elements, since two antenna elements for achieving resonance in a plurality of frequency bands are used and a t-type circuit or PI-type circuit including an inductance element and a capacitance element, which prevents the impedance from becoming infinite in a certain frequency band, is provided between at least one of the antenna elements and a feeding point, the drop in gain that is, the notch portion, can be eliminated and deterioration of the gain can be prevented.

As described above, a multi-resonant antenna device of preferred embodiments of the present invention, which is made to resonate in a plurality of frequency bands, is used for radio communication devices such as portable telephones, and other apparatuses in which requirements for a plurality if frequency bands are supported.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A multi-resonant antenna device comprising;
   an antenna element; and
   an LC resonance circuit arranged to cause the antenna element to resonate in a plurality of frequency bands; wherein
   the LC resonance circuit includes one of a T-type circuit and a PI-type circuit, including an inductance element and a capacitance element, arranged to prevent impedance from becoming infinite in a certain frequency band.

2. The multi-resonant antenna device as claimed in claim 1, wherein the LC resonance circuit includes a diode switching circuit connected in parallel with the one of the T-type circuit and the PI-type circuit.

3. The multi-resonant antenna device as claimed in claim 2, wherein the antenna element is made to resonate in three or more frequency bands by turning on and off the diode switching circuit.

4. The multi-resonant antenna device as claimed in claim 1, wherein the LC resonance circuit is a parallel resonance circuit.

5. The multi-resonant antenna device as claimed in claim 1, wherein the LC resonance circuit is a series resonance circuit.

6. The multi-resonant antenna device as claimed in claim 1, wherein the one of a T-type circuit and a PI-type circuit is a PI-type circuit.

7. The multi-resonant antenna device as claimed in claim 1, wherein the one of a T-type circuit and a PI-type circuit is a T-type circuit and functions as a shunt element.

8. The multi-resonant antenna device as claimed in claim 1, further comprising an inductance element connected between a feeding point and ground.

9. The multi-resonant antenna device as claimed in claim 1, wherein the inductance element functions as a matching element for matching the input impedance of the antenna element to the impedance of a power supply circuit.

10. The multi-resonant antenna device as claimed in claim 1, wherein the antenna element is a chip antenna.

11. The multi-resonant antenna device as claimed in claim 1, further comprising a gain-deterioration-prevention LC circuit connected to the antenna element.

12. A multi-resonant antenna device as claimed in claim 11, wherein the two antenna elements have different resonant frequencies from each other.

13. A multi-resonant antenna device as claimed in claim 11, wherein the two antenna elements are chip antennas.

14. A multi-resonant antenna device as claimed in claim 11, wherein each of the two antenna elements is made to resonate in three or more frequency bands by turning on and off the diode switching circuit.

15. The multi-resonant antenna device as claimed in claim 11, wherein the one of a T-type circuit and a PI-type circuit is a T-type circuit and functions as a shunt element.

16. The multi-resonant antenna device as claimed in claim 11, further comprising an inductance element connected between a feeding point and ground.

17. The multi-resonant antenna device as claimed in claim 11, wherein the inductance element functions as a matching element for matching the input impedance of at least one of the two antenna elements to the impedance of a power supply circuit.

18. The multi-resonant antenna device as claimed in claim 11, further comprising a gain-deterioration-prevention LC circuit connected to at least one of the two antenna elements.

* * * * *